(12) United States Patent
Hsieh

(10) Patent No.: US 11,509,311 B1
(45) Date of Patent: Nov. 22, 2022

(54) TEMPERATURE-CONTROLLED OSCILLATING DEVICE

(71) Applicant: TXC CORPORATION, Taipei (TW)

(72) Inventor: Wan-Lin Hsieh, Ping Cheng (TW)

(73) Assignee: TXC CORPORATION, Taipei (TW)

( * ) Notice: Subject to any disclaimer, the term of this patent is extended or adjusted under 35 U.S.C. 154(b) by 0 days.

(21) Appl. No.: 17/398,867

(22) Filed: Aug. 10, 2021

(51) Int. Cl.
    *H03L 1/02*      (2006.01)
    *H03B 5/04*      (2006.01)

(52) U.S. Cl.
    CPC .............. *H03L 1/022* (2013.01); *H03B 5/04* (2013.01)

(58) Field of Classification Search
    CPC ....................................................... H03L 1/022
    USPC ............................................................ 331/69
    See application file for complete search history.

(56) References Cited

U.S. PATENT DOCUMENTS 9,821,998 B2    11/2017   Gupta et al.
10,291,236 B2 *   5/2019   Chiang ................. H01L 23/345

FOREIGN PATENT DOCUMENTS

TW           201832467 A      9/2018

* cited by examiner

*Primary Examiner* — Joseph Chang
(74) *Attorney, Agent, or Firm* — Birch, Stewart, Kolasch & Birch, LLP

(57) ABSTRACT

A temperature-controlled oscillating device includes a supporting base, a mounting glue, an IC, at least one conducting medium, a temperature sensor, a quartz crystal package, and a heater. The mounting glue is formed on the supporting base. The IC is formed on the mounting glue. The conducting medium and the temperature sensor are formed on the IC. The quartz crystal package is formed on the conducting medium. The quartz crystal package includes a first quartz substrate, a second quartz substrate, and a third quartz substrate. The heater is formed on the quartz crystal package or the IC. There is no base arranged between the IC and the quartz crystal package.

14 Claims, 7 Drawing Sheets

TEMPERATURE-CONTROLLED OSCILLATING DEVICE

BACKGROUND OF THE INVENTION

Field of the Invention

The present invention relates to an oscillating device, particularly to a temperature-controlled oscillating device.

Description of the Related Art

As known, in accordance with the trend of system integration, a variety of electronic systems nowadays are equipped with clock components, and integrating the clock components with sensing elements into the electronic systems has become one of the mainstream 20 technologies in semiconductor packaging technical field. Since taking a quartz crystal piezoelectric element as an oscillator provides an outstanding accuracy and stability, a quartz crystal is mostly adopted for performing as a clock component in the current practice. According to the International Electrotechnical Commission (IEC), quartz-crystal-piezoelectric-element oscillators include four categories: simple package crystal oscillators (SPXO), voltage-controlled crystal oscillators (VCXO), temperature-compensated crystal oscillators (TCXO) and oven-controlled crystal oscillators (OCXO). However, with the rapid developments of the IC industries, it is believed that electronic products tend to show more functions, higher performances, and lighter weight. As such, in order to meet the packaging requirements for high-intensity integration and miniaturization of semiconductor IC chips, it is obvious that the existing packaging technologies are no longer adequate.

In general, in accordance with the miniaturization of semiconductor piezoelectric devices, the quartz crystal and the integrated circuit are usually respectively packaged along with ceramic materials first, and the subsequent electrical connections are successively performed by employing the current existing technologies. However, since the quartz crystal may decline to contact with its bottom base layer, the existing packaging structure usually has a cavity on the surface of its bottom base layer so as to use such cavity for accommodating the quartz crystal. In the cavity, the quartz crystal adheres to the ceramic base through an adhesive. Nevertheless, the performance of the quartz crystal becomes poor due to aging of the adhesive. Besides, the ceramic packaging structure includes multiple stacked ceramic layers. The ceramic layers are difficultly aligned to each other. If the ceramic layers are not precisely aligned to each other, the performance of the quartz crystal will become poor and the whole ceramic package will not minimized. In order to precisely align the ceramic layers, the fabrication cost needs to increase.

To overcome the abovementioned problems, the present invention provides a temperature-controlled oscillating device, so as to solve the afore-mentioned problems of the prior art.

SUMMARY OF THE INVENTION

The primary objective of the present invention is to provide a temperature-controlled oscillating device, which avoids decreasing the performance of a quartz crystal due to aging of an adhesive, achieves minimization, and saves the fabrication cost.

In an embodiment of the present invention, the present invention provides a temperature-controlled oscillating device includes a supporting base, a mounting glue, an integrated circuit (IC), at least one conducting medium, a temperature sensor, a quartz crystal package, and a heater. The mounting glue is formed on the supporting base. The IC is formed on the mounting glue. The conducting medium and the temperature sensor are formed on the IC. The quartz crystal package is formed on the conducting medium. The quartz crystal package includes a first quartz substrate, a second quartz substrate, and a third quartz substrate. The first quartz substrate is formed on the conducting medium. The second quartz substrate has a border area and a resonating area. The border area surrounds and connects the resonating area. The thickness of the resonating area is less than the thickness of the border area. The third quartz substrate is formed on the border area of the second quartz substrate. The heater is formed on the quartz crystal package or the IC. There is no base arranged between the IC and the quartz crystal package.

In an embodiment of the present invention, the conducting medium includes a conducting glue. The IC is provided with first conductive pads thereon. The conducting medium and the first conductive pads are arranged on different areas of the IC. The third quartz substrate is provided with second conductive pads thereon. The second conductive pads and the first conductive pads are electrically connected to each other through conductive wires.

In an embodiment of the present invention, the conducting medium includes conducting pads.

In an embodiment of the present invention, the temperature-controlled oscillating device further includes bonding terminals formed on a bottom of the supporting base.

In an embodiment of the present invention, the temperature-controlled oscillating device further includes a cover formed on the supporting base, wherein the cover shields the mounting glue, the at least one conducting medium, the IC, the quartz crystal package, the temperature sensor, and the heater.

In an embodiment of the present invention, the quartz crystal package further includes a fourth quartz substrate formed between the first quartz substrate and the at least one conducting medium.

In an embodiment of the present invention, the heater is formed on the third quartz substrate.

In an embodiment of the present invention, the heater is embedded in the quartz crystal package.

In an embodiment of the present invention, the temperature-controlled oscillating device further includes a passive component integrated with the quartz crystal package.

In an embodiment of the present invention, the heater is embedded between the first quartz substrate and the conducting medium or embedded between the conducting medium and the IC.

In an embodiment of the present invention, the temperature-controlled oscillating device further includes an encapsulating glue covering the supporting base, the mounting glue, the IC, the conducting medium, the quartz crystal package, the temperature sensor, and the heater.

In an embodiment of the present invention, the supporting base is a quartz base.

In an embodiment of the present invention, the supporting base is a lead frame.

In an embodiment of the present invention, the temperature-controlled oscillating device further includes an encapsulating glue formed on the supporting base, wherein the encapsulating glue covers the mounting glue, the IC, the conducting medium, the quartz crystal package, the temperature sensor, and the heater.

To sum up, the temperature-controlled oscillating device stacks the quartz crystal package on the IC, wherein the quartz crystal package includes three stacked quartz substrates. Thus, the temperature-controlled oscillating device avoids decreasing the performance of a quartz crystal due to aging of an adhesive, achieves minimization, and saves the fabrication cost.

Below, the embodiments are described in detail in cooperation with the drawings to make easily understood the technical contents, characteristics and accomplishments of the present invention.

DETAILED DESCRIPTION OF THE INVENTION

Figure 1:
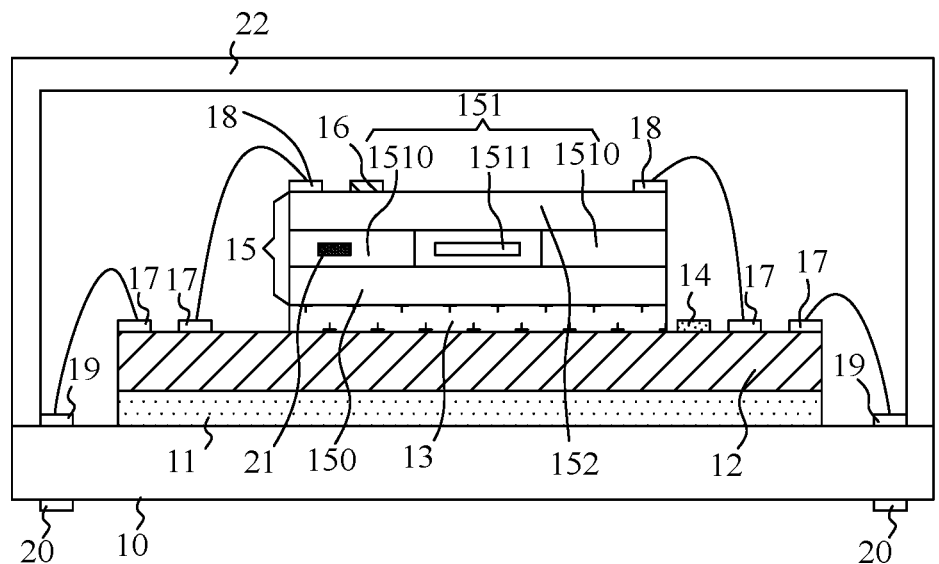
FIG. 1 is a diagram schematically showing a temperature-controlled oscillating device according to a first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, a temperature-controlled oscillating device will be provided. The temperature-controlled oscillating device uses a semiconductor process to fabricate a wafer-level quartz crystal package, stacks the wafer-level quartz crystal package on an integrated circuit, avoids decreasing the performance of a quartz crystal due to aging of an adhesive, achieves minimization, and saves the fabrication cost.

FIG. 1 is a diagram schematically showing a temperature-controlled oscillating device according to a first embodiment of the present invention. Referring to FIG. 1, the first embodiment of the present invention is introduced as follows. The temperature-controlled oscillating device 1 includes a supporting base 10, a mounting glue 11, an integrated circuit (IC) 12, at least one conducting medium 13, a temperature sensor 14, a quartz crystal package 15, and a heater 16. For clarity and convenience, the first embodiment exemplifies one conducting medium 13. The conducting medium 13 may be implemented with a conducting glue. Besides, the supporting base 10 may be implemented with a quartz base, but the present invention is not limited thereto. The mounting glue 11 is formed on the supporting base 10. The IC 12 is formed on the mounting glue 11. The conducting medium 13 and the temperature sensor 14 are formed on the IC 12. The quartz crystal package 15 is formed on the conducting medium 13. The quartz crystal package 15 includes a first quartz substrate 150, a second quartz substrate 151, and a third quartz substrate 152. The first quartz substrate 150 is formed on the conducting medium 13. The second quartz substrate 151 has a border area 1510 and a resonating area 1511. The border area 1510 surrounds and connects the resonating area 1511. The thickness of the resonating area 1511 is less than the thickness of the border area 1510. The third quartz substrate 152 is formed on the border area 1510 of the second quartz substrate 151. The heater 16 is formed on the quartz crystal package 15 or the IC 12. There is no base such as a ceramic base arranged between the IC 12 and the quartz crystal package 15, such that the IC 2 easily controls the temperature of the quartz crystal package 15. The quartz crystal package 15 is fabricated using the semiconductor process to avoid decreasing the performance of a quartz crystal due to aging of an adhesive, achieve minimization, and save the fabrication cost.

In some embodiments of the present invention, the IC 12 is provided with first conductive pads 17 thereon. The conducting medium 13, the temperature sensor 14, and the first conductive pads 17 are arranged on different areas of the IC 12. The third quartz substrate 152 is provided with second conductive pads 18 thereon. The second conductive pads 18 and the first conductive pads 17 are electrically connected to each other through conductive wires. The supporting base 10 may be provided with third conductive pads 19 thereon. The third conductive pads 19 and the first conductive pads 17 are electrically connected to each other through conductive wires. In addition, the temperature-controlled oscillating device 1 may further include bonding terminals 20, a passive component 21, and a cover 22. The bonding terminals 20 are formed on the bottom of the supporting base 10. The passive component 21 is integrated with the quartz crystal package 15. The cover 22, formed on the supporting base, shields the mounting glue 11, the IC 12, the conducting medium 13, the temperature sensor 14, the quartz crystal package 15, the heater 16, the first conductive pads 17, the second conductive pads 18, the third conductive pads 19, and the passive component 21.

Figure 2:
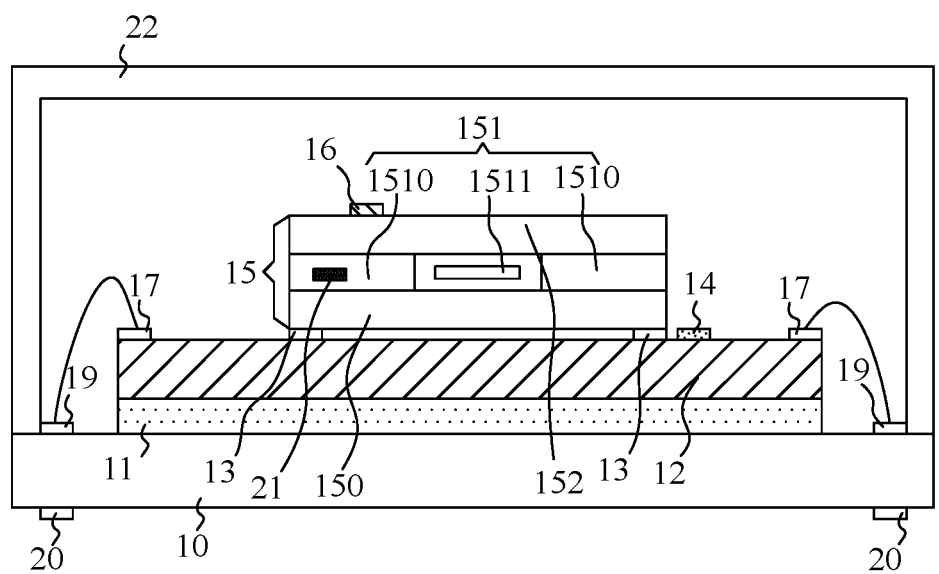
FIG. 2 is a diagram schematically showing a temperature-controlled oscillating device according to a second embodiment of the present invention.

FIG. 2 is a diagram schematically showing a temperature-controlled oscillating device according to a second embodiment of the present invention. Referring to FIG. 2, the second embodiment of the present invention is introduced as follows. The second embodiment is different from the first embodiment in the conducting medium 13. The second embodiment exemplifies conducting mediums 13 implemented with conducting pads. As a result, the quartz crystal package 15 is electrically connected to the IC 12 through the conducting mediums 13. Compared with the first embodiment, the second embodiment lacks the second conductive pads on the quartz crystal package 15.

Figure 3:
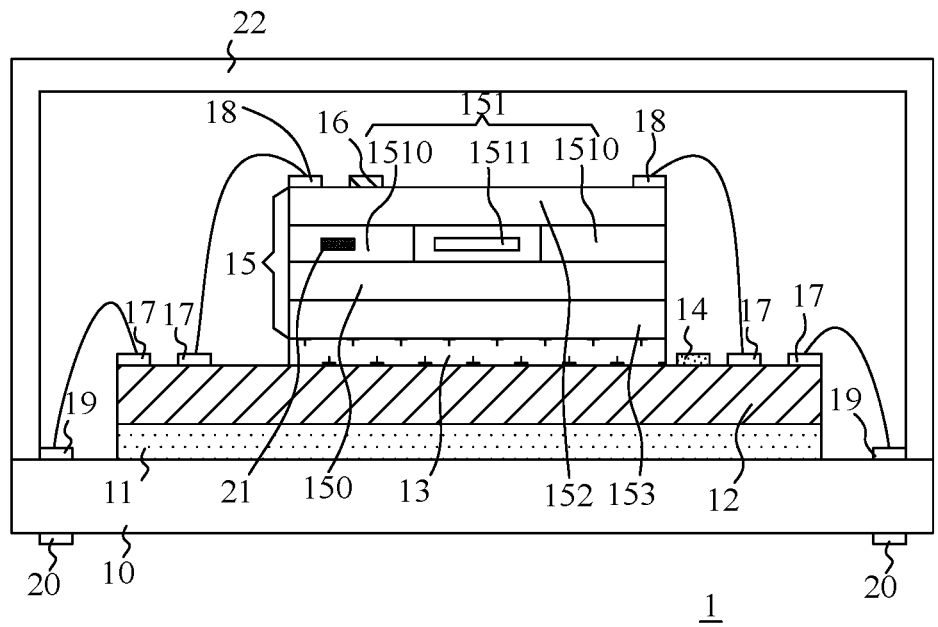
FIG. 3 is a diagram schematically showing a temperature-controlled oscillating device according to a third embodiment of the present invention.

FIG. 3 is a diagram schematically showing a temperature-controlled oscillating device according to a third embodiment of the present invention. Referring to FIG. 3, the third embodiment of the present invention is introduced as follows. The third embodiment is different from the first embodiment in the quartz crystal package 15. In the third embodiment, the quartz crystal package 15 may further include a fourth quartz substrate 153 formed between the first quartz substrate 150 and the conducting medium 13.

Figure 4:
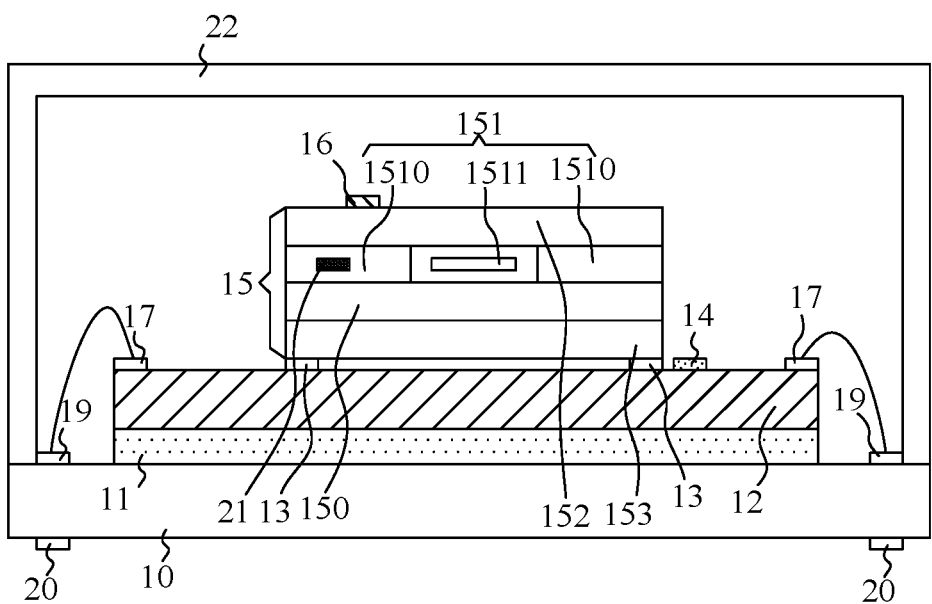
FIG. 4 is a diagram schematically showing a temperature-controlled oscillating device according to a fourth embodiment of the present invention.

FIG. 4 is a diagram schematically showing a temperature-controlled oscillating device according to a fourth embodiment of the present invention. Referring to FIG. 4, the fourth embodiment of the present invention is introduced as follows. The fourth embodiment is different from the second embodiment in the quartz crystal package 15. In the fourth embodiment, the quartz crystal package 15 may further include a fourth quartz substrate 153 formed between the first quartz substrate 150 and the conducting medium 13.

Figure 5A:
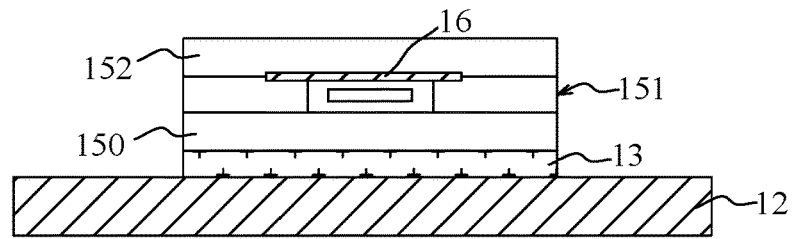
FIGS. 5(a)-5(e) are diagrams schematically showing a quartz crystal package, an IC, at least one conducting medium, and a heater according to different embodiments of the present invention.
Figure 5B:
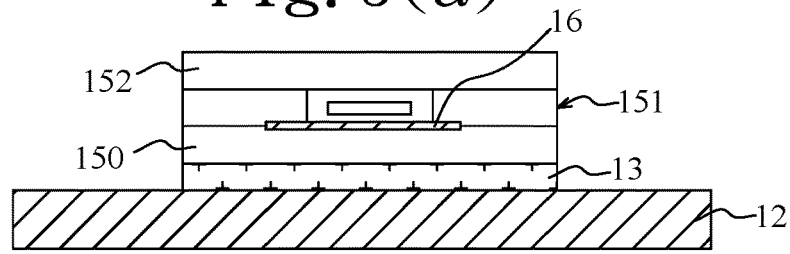
Figure 5C:
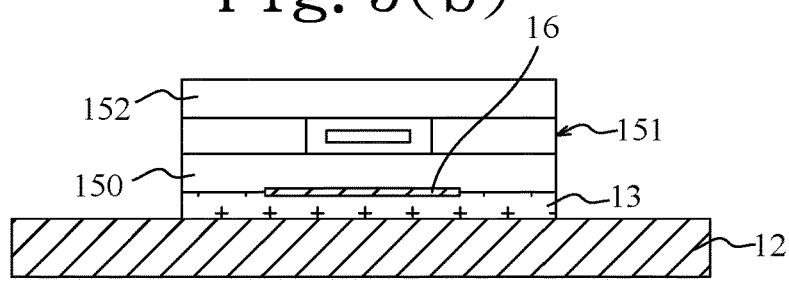
Figure 5D:
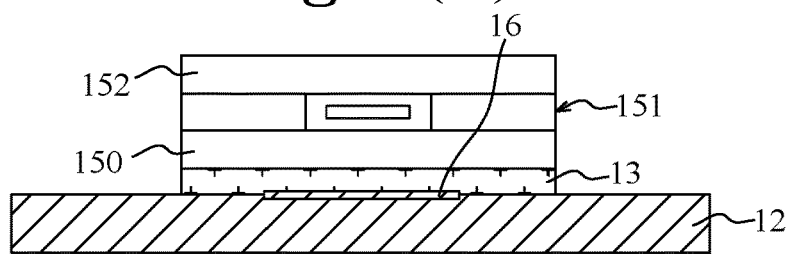
Figure 5E:
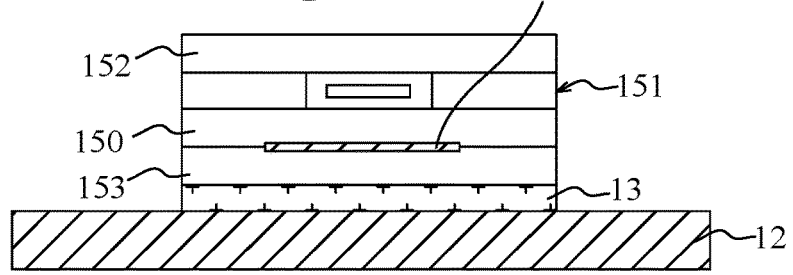

FIGS. 5(a)-5(e) are diagrams schematically showing a quartz crystal package, an IC, at least one conducting medium, and a heater according to different embodiments of the present invention. As shown in FIGS. 1-4, the foregoing embodiments form the heater 16 on the third quartz substrate 152, but the present invention is not limited thereto. Referring to FIGS. 5(a)-5(e), the heater 16 may be embedded in the quartz crystal package 15. As shown in FIG. 5(a), the heater 16 is embedded between the second quartz substrate 151 and the third quartz substrate 152. As shown in FIG. 5(b), the heater 16 is embedded between the second quartz substrate 151 and the first quartz substrate 150. As shown in FIG. 5(c), the heater 16 is embedded between the first quartz substrate 150 and the conducting medium 13. As shown in FIG. 5(d), the heater 16 is embedded between the conducting medium 13 and the IC 12. As shown in FIG. 5(e), the heater 16 is embedded between the fourth quartz substrate 153 and the third quartz substrate 152.

Figure 6:
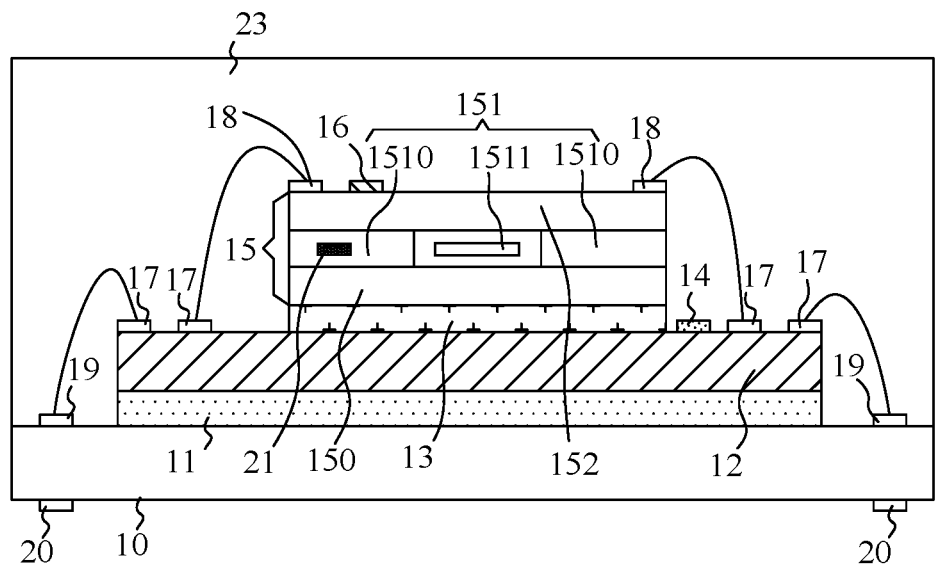
FIG. 6 is a diagram schematically showing a temperature-controlled oscillating device according to a fifth embodiment of the present invention.

FIG. 6 is a diagram schematically showing a temperature-controlled oscillating device according to a fifth embodiment of the present invention. Referring to FIG. 6, the fifth embodiment of the present invention is introduced as follows. The fifth embodiment is different from the first embodiment in the cover. The cover of the first embodiment is replaced with an encapsulating glue 23 of the fifth embodiment. In the fifth embodiment, the encapsulating glue 23 covers the supporting base 10, the mounting glue 11, the IC 12, the conducting medium 13, the temperature sensor 14, the quartz crystal package 15, the heater 16, the first conductive pads 17, the second conductive pads 18, the third conductive pads 19, and the passive component 21.

Figure 7:
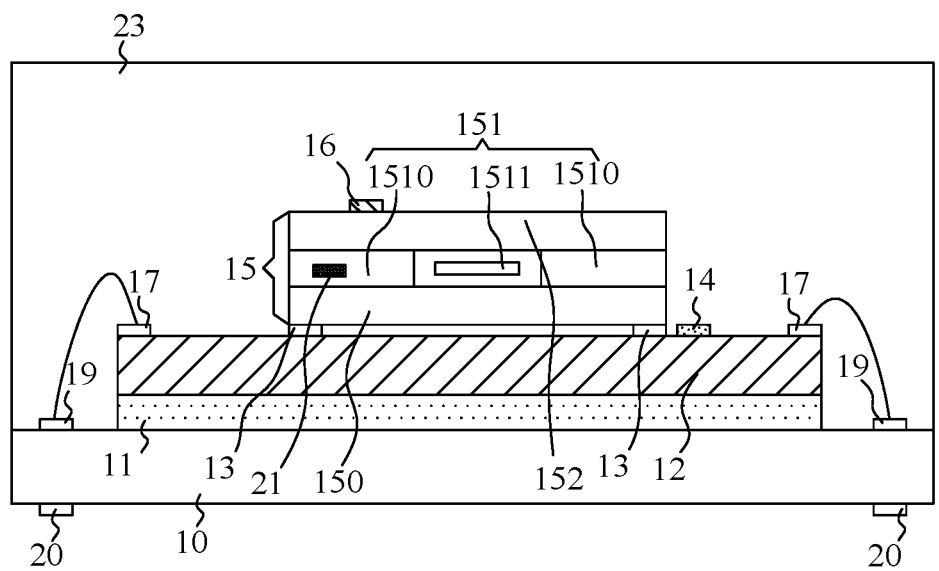
FIG. 7 is a diagram schematically showing a temperature-controlled oscillating device according to a sixth embodiment of the present invention.

FIG. 7 is a diagram schematically showing a temperature-controlled oscillating device according to a sixth embodiment of the present invention. Referring to FIG. 7, the sixth embodiment of the present invention is introduced as follows. The sixth embodiment is different from the second embodiment in the cover. The cover of the second embodiment is replaced with an encapsulating glue 23 of the sixth embodiment. In the sixth embodiment, the encapsulating glue 23 covers the supporting base 10, the mounting glue 11, the IC 12, the conducting mediums 13, the temperature sensor 14, the quartz crystal package 15, the heater 16, the first conductive pads 17, the third conductive pads 19, and the passive component 21.

Figure 8:
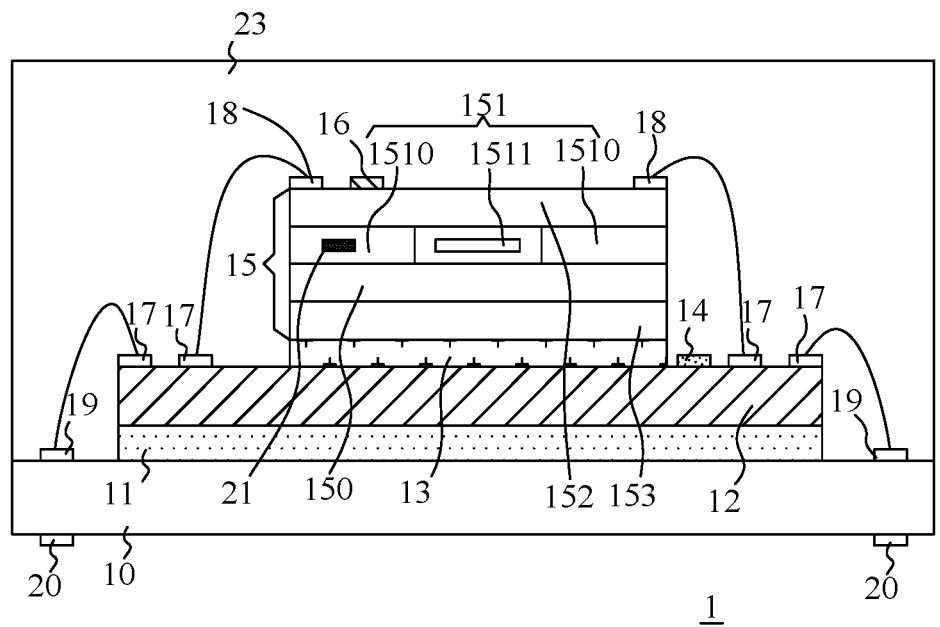
FIG. 8 is a diagram schematically showing a temperature-controlled oscillating device according to a seventh embodiment of the present invention.

FIG. 8 is a diagram schematically showing a temperature-controlled oscillating device according to a seventh embodiment of the present invention. Referring to FIG. 8, the seventh embodiment of the present invention is introduced as follows. The seventh embodiment is different from the third embodiment in the cover. The cover of the third embodiment is replaced with an encapsulating glue 23 of the seventh embodiment. In the seventh embodiment, the encapsulating glue 23 covers the supporting base 10, the mounting glue 11, the IC 12, the conducting medium 13, the temperature sensor 14, the quartz crystal package 15, the heater 16, the first conductive pads 17, the second conductive pads 18, the third conductive pads 19, and the passive component 21.

Figure 9:
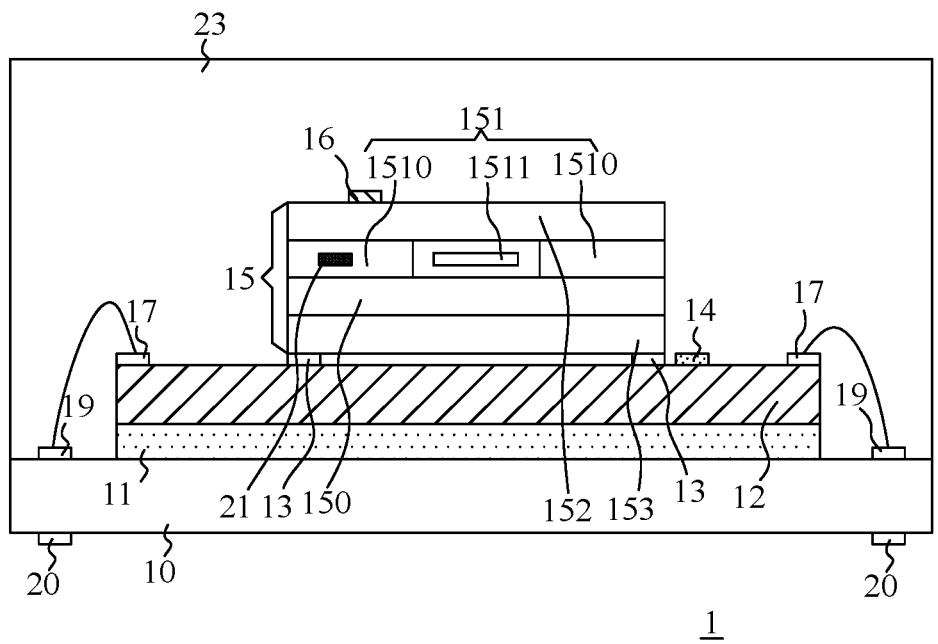
FIG. 9 is a diagram schematically showing a temperature-controlled oscillating device according to an eighth embodiment of the present invention.

FIG. 9 is a diagram schematically showing a temperature-controlled oscillating device according to an eighth embodiment of the present invention. Referring to FIG. 9, the eighth embodiment of the present invention is introduced as follows. The eighth embodiment is different from the fourth embodiment in the cover. The cover of the fourth embodiment is replaced with an encapsulating glue 23 of the eighth embodiment. In the eighth embodiment, the encapsulating glue 23 covers the supporting base 10, the mounting glue 11, the IC 12, the conducting mediums 13, the temperature sensor 14, the quartz crystal package 15, the heater 16, the first conductive pads 17, the third conductive pads 19, and the passive component 21.

Figure 10:
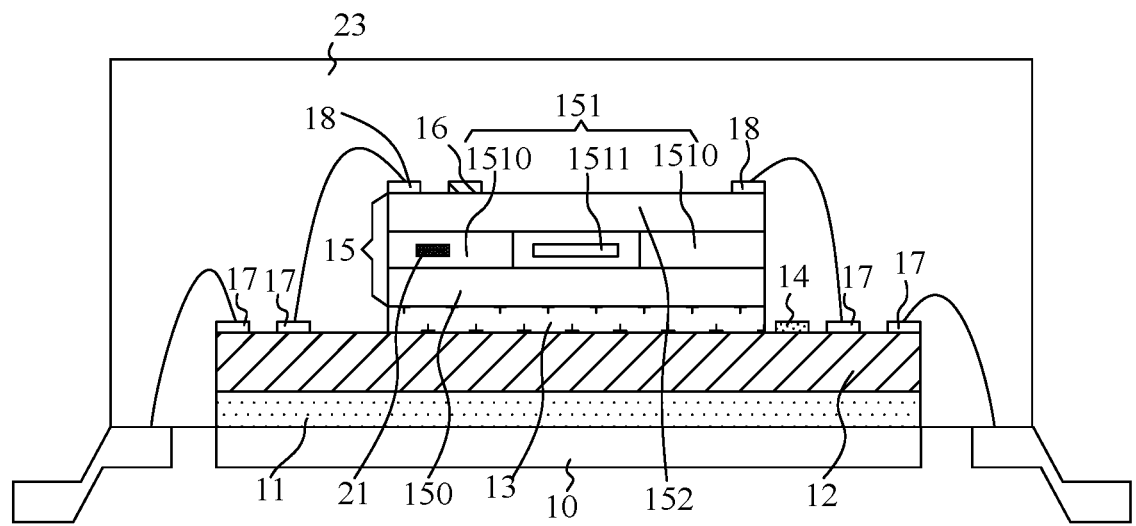
FIG. 10 is a diagram schematically showing a temperature-controlled oscillating device according to a ninth embodiment of the present invention.

FIG. 10 is a diagram schematically showing a temperature-controlled oscillating device according to a ninth embodiment of the present invention. Referring to FIG. 10, the ninth embodiment of the present invention is introduced as follows. The ninth embodiment is different from the first embodiment in the cover and the supporting base 10. The cover of the first embodiment is replaced with an encapsulating glue 23 of the ninth embodiment. In the ninth embodiment, the supporting base 10 is implemented with a lead frame. Compared with the first embodiment, the ninth embodiment lacks the third conductive pads and the bonding terminals. In the ninth embodiment, the encapsulating glue 23, formed on the supporting base 10, covers the mounting glue 11, the IC 12, the conducting medium 13, the temperature sensor 14, the quartz crystal package 15, the heater 16, the first conductive pads 17, the second conductive pads 18, and the passive component 21.

Figure 11:
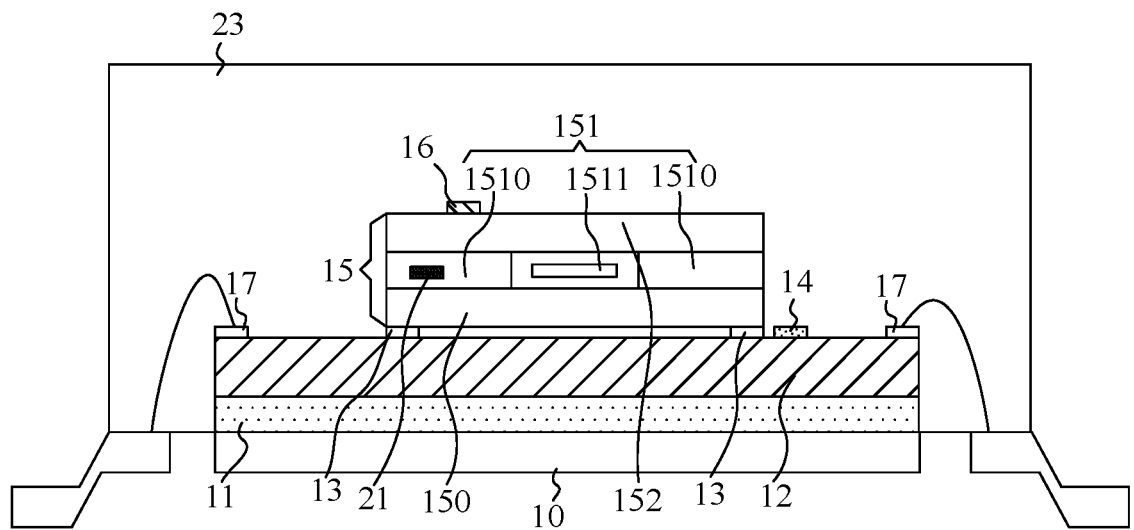
FIG. 11 is a diagram schematically showing a temperature-controlled oscillating device according to a tenth embodiment of the present invention.

FIG. 11 is a diagram schematically showing a temperature-controlled oscillating device according to a tenth embodiment of the present invention. Referring to FIG. 11, the tenth embodiment of the present invention is introduced as follows. The tenth embodiment is different from the second embodiment in the cover and the supporting base 10. The cover of the second embodiment is replaced with an encapsulating glue 23 of the tenth embodiment. In the tenth embodiment, the supporting base 10 is implemented with a lead frame. Compared with the second embodiment, the tenth embodiment lacks the third conductive pads and the bonding terminals. In the tenth embodiment, the encapsulating glue 23, formed on the supporting base 10, covers the mounting glue 11, the IC 12, the conducting mediums 13, the temperature sensor 14, the quartz crystal package 15, the heater 16, the first conductive pads 17, and the passive component 21.

Figure 12:
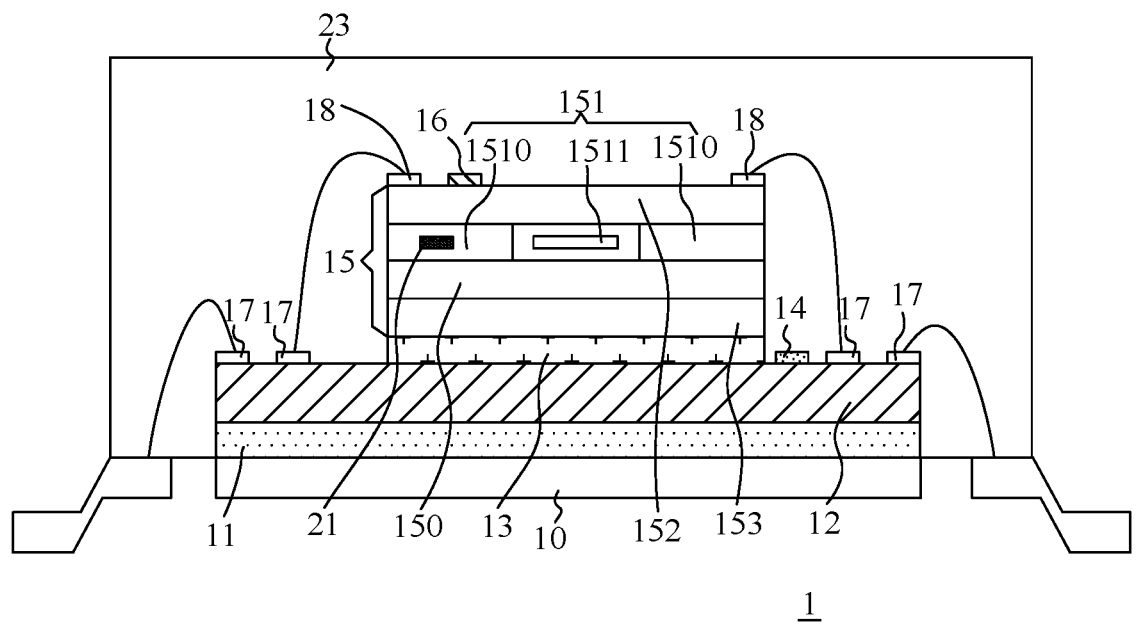
FIG. 12 is a diagram schematically showing a temperature-controlled oscillating device according to an eleventh embodiment of the present invention.

FIG. 12 is a diagram schematically showing a temperature-controlled oscillating device according to an eleventh embodiment of the present invention. Referring to FIG. 12, the eleventh embodiment of the present invention is introduced as follows. The eleventh embodiment is different from the third embodiment in the cover and the supporting base 10. The cover of the third embodiment is replaced with an encapsulating glue 23 of the eleventh embodiment. In the eleventh embodiment, the supporting base 10 is implemented with a lead frame. Compared with the third embodiment, the eleventh embodiment lacks the third conductive pads and the bonding terminals. In the eleventh embodiment, the encapsulating glue 23, formed on the supporting base 10, covers the mounting glue 11, the IC 12, the conducting medium 13, the temperature sensor 14, the quartz crystal package 15, the heater 16, the first conductive pads 17, the second conductive pads 18, and the passive component 21.

Figure 13:
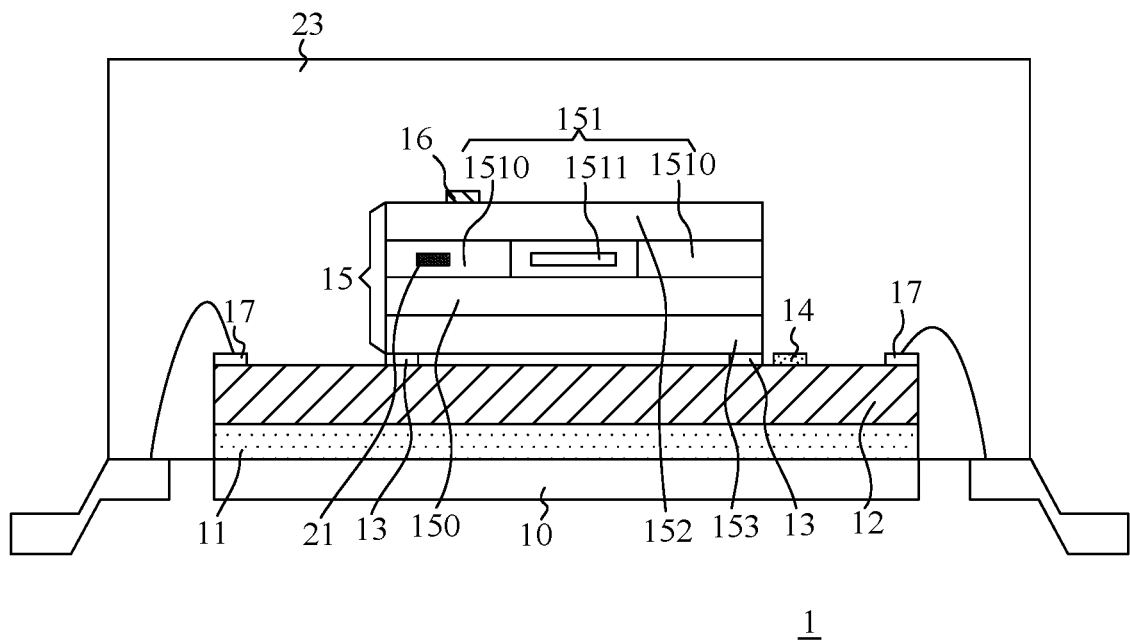
FIG. 13 is a diagram schematically showing a temperature-controlled oscillating device according to a twelfth embodiment of the present invention.

FIG. 13 is a diagram schematically showing a temperature-controlled oscillating device according to a twelfth embodiment of the present invention. Referring to FIG. 13, the twelfth embodiment of the present invention is introduced as follows. The twelfth embodiment is different from the fourth embodiment in the cover and the supporting base 10. The cover of the fourth embodiment is replaced with an encapsulating glue 23 of the twelfth embodiment. In the twelfth embodiment, the supporting base 10 is implemented with a lead frame. Compared with the fourth embodiment, the twelfth embodiment lacks the third conductive pads and the bonding terminals. In the twelfth embodiment, the encapsulating glue 23, formed on the supporting base 10, covers the mounting glue 11, the IC 12, the conducting mediums 13, the temperature sensor 14, the quartz crystal package 15, the heater 16, the first conductive pads 17, and the passive component 21. In the ninth, tenth, eleventh, and twelfth embodiments, lead frame packages can be used, such as quad flat no-lead (QFN), advanced quad flat no-lead (aQFN), quad flat package (QFP), low profile and thin quad flat packages (LQFP/TQFP), plastic leaded chip carrier (PLCC), small outline (SO), or plastic dual-in-line packaging (PDIP).

According to the embodiments provided above, temperature-controlled oscillating device stacks the quartz crystal package on the IC, wherein the quartz crystal package includes three stacked quartz substrates. Thus, the temperature-controlled oscillating device avoids decreasing the performance of a quartz crystal due to aging of an adhesive, achieves minimization, and saves the fabrication cost.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A temperature-controlled oscillating device comprising:
   a supporting base;
   a mounting glue formed on the supporting base;
   an integrated circuit (IC) formed on the mounting glue;
   at least one conducting medium and a temperature sensor formed on the IC;
   a quartz crystal package formed on the at least one conducting medium, wherein the quartz crystal package comprises:
   a first quartz substrate formed on the at least one conducting medium;
   a second quartz substrate having a border area and a resonating area, wherein the border area surrounds and connects the resonating area and a thickness of the resonating area is less than a thickness of the border area; and a third quartz substrate formed on the border area of the second quartz substrate; and a heater formed on the quartz crystal package or the IC.

2. The temperature-controlled oscillating device according to claim 1, wherein the at least one conducting medium comprises a conducting glue, the IC is provided with first conductive pads thereon, the at least one conducting medium and the first conductive pads are arranged on different areas of the IC, the third quartz substrate is provided with second conductive pads thereon, and the second conductive pads and the first conductive pads are electrically connected to each other through conductive wires.

3. The temperature-controlled oscillating device according to claim 1, wherein the at least one conducting medium comprises conducting pads.

4. The temperature-controlled oscillating device according to claim 1, further comprising bonding terminals formed on a bottom of the supporting base.

5. The temperature-controlled oscillating device according to claim 1, further comprising a cover formed on the supporting base, wherein the cover shields the mounting glue, the at least one conducting medium, the IC, the quartz crystal package, the temperature sensor, and the heater.

6. The temperature-controlled oscillating device according to claim 1, wherein the quartz crystal package further comprises a fourth quartz substrate formed between the first quartz substrate and the at least one conducting medium.

7. The temperature-controlled oscillating device according to claim 1, wherein the heater is formed on the third quartz substrate.

8. The temperature-controlled oscillating device according to claim 1, wherein the heater is embedded in the quartz crystal package.

9. The temperature-controlled oscillating device according to claim 1, further comprising a passive component integrated with the quartz crystal package.

10. The temperature-controlled oscillating device according to claim 1, wherein the heater is embedded between the first quartz substrate and the at least one conducting medium or embedded between the at least one conducting medium and the IC.

11. The temperature-controlled oscillating device according to claim 1, further comprising an encapsulating glue covering the supporting base, the mounting glue, the IC, the at least one conducting medium, the quartz crystal package, the temperature sensor, and the heater.

12. The temperature-controlled oscillating device according to claim 1, wherein the supporting base is a quartz base.

13. The temperature-controlled oscillating device according to claim 1, wherein the supporting base is a lead frame.

14. The temperature-controlled oscillating device according to claim 13, further comprising an encapsulating glue formed on the supporting base, wherein the encapsulating glue covers the mounting glue, the IC, the at least one conducting medium, the quartz crystal package, the temperature sensor, and the heater.

* * * * *